(12) United States Patent
Creighton et al.

(10) Patent No.: US 7,449,404 B1
(45) Date of Patent: Nov. 11, 2008

(54) METHOD FOR IMPROVING MG DOPING DURING GROUP-III NITRIDE MOCVD

(75) Inventors: J. Randall Creighton, Albuquerque, NM (US); George T. Wang, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 450 days.

(21) Appl. No.: 11/115,685

(22) Filed: Apr. 26, 2005

Related U.S. Application Data

(60) Provisional application No. 60/565,945, filed on Apr. 27, 2004.

(51) Int. Cl.
*H01L 21/28* (2006.01)

(52) U.S. Cl. ..................................... 438/604
(58) Field of Classification Search ............... 438/604, 438/791, 792, 793, 794
See application file for complete search history.

(56) References Cited

U.S. PATENT DOCUMENTS

2002/0014629 A1 * 2/2002 Shibata et al. ............... 257/79

OTHER PUBLICATIONS

Huili Xing et al, "Memory Effect and Redistribution of Mg into Sequentially Regrown GaN Layer by Metalorganic Chemical Vapor Deposition" The Japan society of Applied Physics, vol. 42 (2003) pp. 50-53.

Y. Ohba et al, "A study on strong memory effects for Mg doping in GaN metalorganic chemical vapor deposition", Journal of Crystal Growth, 1994, vol. 145 pp. 214-218.

Matthew J. Schurman, et al, "Reproducibility of GaN and InGaN films grown in a multi-wafer rotating-disc reactor", Materials Science and Engineering, B43, 1997 pp. 222-227.

B. Beaumont, et al, "Violet GaN based light emitting diodes fabricated by metal organics vapour phase epitaxy", Materials Science and Engineering B50, 1997 pp. 296-301.

G. T. Wang et al, "Complex Formation between Magnesocene (MgCp2) and NH3: Implications for p-Type Doping of Group III Nitrides and the MgMemory Effect", Journal of Physical Chemistry A, vol. 108, No. 22, 20048 pp. 4873-4877.

* cited by examiner

*Primary Examiner*—Zandra V. Smith
*Assistant Examiner*—Colleen E Rodgers
(74) *Attorney, Agent, or Firm*—Carol I Ashby

(57) ABSTRACT

A method for improving Mg doping of Group III-N materials grown by MOCVD preventing condensation in the gas phase or on reactor surfaces of adducts of magnesocene and ammonia by suitably heating reactor surfaces between the location of mixing of the magnesocene and ammonia reactants and the Group III-nitride surface whereon growth is to occur.

10 Claims, 2 Drawing Sheets

METHOD FOR IMPROVING MG DOPING DURING GROUP-III NITRIDE MOCVD

This application claims priority benefit from U.S. Provisional Patent Application Ser. No. 60/565,945, filed on Apr. 27, 2004, which is incorporated herein by reference.

The United States Government has rights in this invention pursuant to Department of Energy Contract No. DE-AC04-94AL85000 with Sandia Corporation.

BACKGROUND OF THE INVENTION

Magnesium serves as the dominant p-type dopant species in GaN and its alloys, and it is typically delivered during metalorganic chemical vapor deposition (MOCVD) via the organometallic precursor magnesocene ($MgCp_2$, Cp=cyclopentadienyl). Unfortunately, controlled incorporation of Mg into III-nitride films via MOCVD has not been without serious problems. Frequently, unpredictable Mg concentration profiles occur that can vary greatly after the reactor has been perturbed (for example, from any repair) or even between sequential wafer-growth runs. Even in reactors in which the Mg doping process is largely reproducible, the Mg profile in the grown films is marked by gradients corresponding to the turn-on and turn off of the doping process. This behavior, commonly referred to as a Mg "memory effect," is problematic since abrupt doping profiles rather than doping gradients are often required for optimal device performance.

The Mg doping response was reported for GaN MOCVD in Y. Ohba and A. Hatano, "A study on strong memory effects for Mg doping in GaN metalorganic chemical vapor deposition," J. Crystal Growth 145 (1994) p. 214-218. A delay time was observed between Mg atom incorporation into the growing layer and the supplying of the Mg source to the reactor, in spite of the quick response for doping turn off. The delay time was considered to originate from adsorption of Mg source molecules on the reactor wall.

Redistribution of Mg into a subsequently regrown GaN epilayer grown by MOCVD has been studied (H. Xing et al, "Memory Effect and Redistribution of Mg into Sequentially Regrown GaN Layer by Metalorganic Chemical Vapor Deposition," Jpn. J. Appl. Phys. 42 (2003) p. 50-53.) The regrowth study using a Mg-free reactor revealed that a Mg-rich film was present on MOCVD as-grown GaN:Mg base layers that could be removed by an acid etch, and that a slow Mg decay into the sequentially regrown GaN resulted from the Mg-rich surface film.

Memory effects have been seen in the growth of sequential layers in a single wafer. Secondary-ion mass spectroscopy (SIMS) has been used to study the Mg concentration in a sample with sequentially grown layers of undoped and Mg-doped GaN (J. Schurman et al, "Reproducibility of GaN and InGaN films grown in a multi-wafer rotating-disc reactor," Mater. Sci. Engin. B43 (1997) p. 222-227). For each layer, the Mg concentration started out low and slowly increased during the growth of the layer. Also of interest was the increase in the background Mg concentration between each Mg-doped layer. A sample was grown with sequentially grown layers of Mg- and Si-doped GaN. The Mg background concentration is seen to increase between Mg layers. The overall level of Mg in the reactor slowly decayed after the growth of the last Mg-doped layer. This was evident from the slow drop in the Mg level in the top Si-doped layer of the structure.

SUMMARY OF THE INVENTION

This invention comprises a method for obtaining reproducible Mg doping of Group III-nitride materials with more abrupt doping profiles than those obtained when the memory effect is operable. The method comprises maintaining reactor surfaces and gas mixtures at temperatures above the Mg precursor-ammonia adduct condensation temperature.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate some embodiments of the present invention and, together with the description, serve to explain the principles of the invention.

DETAILED DESCRIPTION OF THE INVENTION

This invention comprises a method for improving Mg doping of Group III-N materials grown by MOCVD preventing condensation in the gas phase or on reactor surfaces of adducts of magnesocene or other magnesium precursor and ammonia by heating reactor surfaces between the location of mixing of the magnesocene and ammonia reactants and the Group III-nitride surface whereon growth is to occur.

Figure 1:
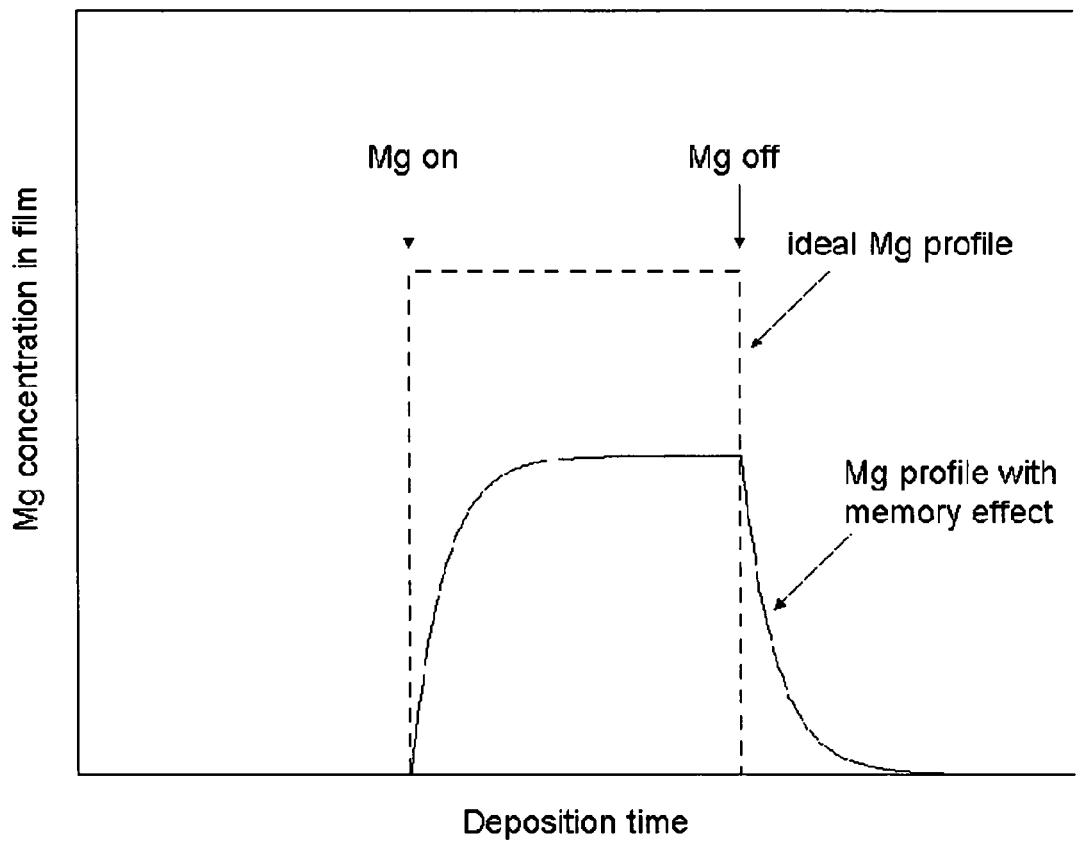
FIG. 1 illustrates the Mg doping gradients resulting from the memory effect.

Magnesium serves as the dominant p-type dopant for GaN and its alloys, and is typically delivered during MOCVD via the organometallic precursor magnesocene ($MgCp_2$, Cp=cyclopentadienyl) or bismethylcyclopentadienyl magnesium $(MeCp)_2Mg$. Unfortunately, to date controlled incorporation of Mg into Group III-nitride (also termed III-nitride) films via MOCVD has suffered from some rather serious problems. The result is often unpredictable Mg concentration profiles that may vary from expected values after the reactor has been perturbed (for example, after repair of the reactor) or even between sequential depositions. Even in reactors in which the Mg doping process is fairly reproducible, the Mg profile in the grown films is marked by long transients corresponding to the turn-on and turn off of the doping process (FIG. 1). This problem, commonly referred to as a Mg "memory effect," is problematic since abrupt doping profiles between adjacent layers of a Group III-nitride structure are required for optimal device performance.

Adducts form between $MgCp_2$ and $NH_3$ that are the major source of the memory effect. The interaction between $MgCp_2$ and $NH_3$ has been studied at typical III-nitride reactor inlet conditions (G. T. Wang and J. R. Creighton, "Complex Formation between Magnesocene ($MgCp_2$) and $NH_3$: Implications for p-Type Doping of Group III Nitrides and Mg Memory Effect", J. Phys. Chem. A., 108 (2004) 4873-4877). This work was the first in-depth investigation of the reaction between $MgCp_2$ and $NH_3$, and was performed using a joint experimental and theoretical approach. The results indicated that complexation reactions between $MgCp_2$ and $NH_3$ are can play a major role in the Mg doping "memory effects" and erratic incorporation problems. These reactions can produce both a 1:1 adduct; $Cp_2Mg:NH_3$, and a 2:1 adduct; $Cp_2Mg(:NH_3)_2$ (FIG. 2), both of which have very low vapor pressures (<<1 mTorr). Condensation of these adducts on the reactor walls, as well as homogeneous nucleation of crystalline adduct from the gas phase to form particles can effectively remove the Mg precursor from the gas stream and provide a source of residual Mg after the flow of $Cp_2Mg$ has been halted. The reactions are totally reversible, indicating an equilibrium phenomenon, as shown in Eqs. 1 and 2 and FIG. 2.

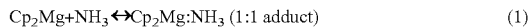

$$Cp_2Mg+NH_3 \leftrightarrow Cp_2Mg:NH_3 \text{ (1:1 adduct)} \quad (1)$$

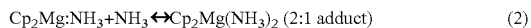

$$Cp_2Mg:NH_3+NH_3 \leftrightarrow Cp_2Mg(NH_3)_2 \text{ (2:1 adduct)} \quad (2)$$

$$K_p = \frac{P(MgCp_2(NH_3)_2)}{P(MgCp_2)P^2(NH_3)} \quad (3)$$

Figure 3:
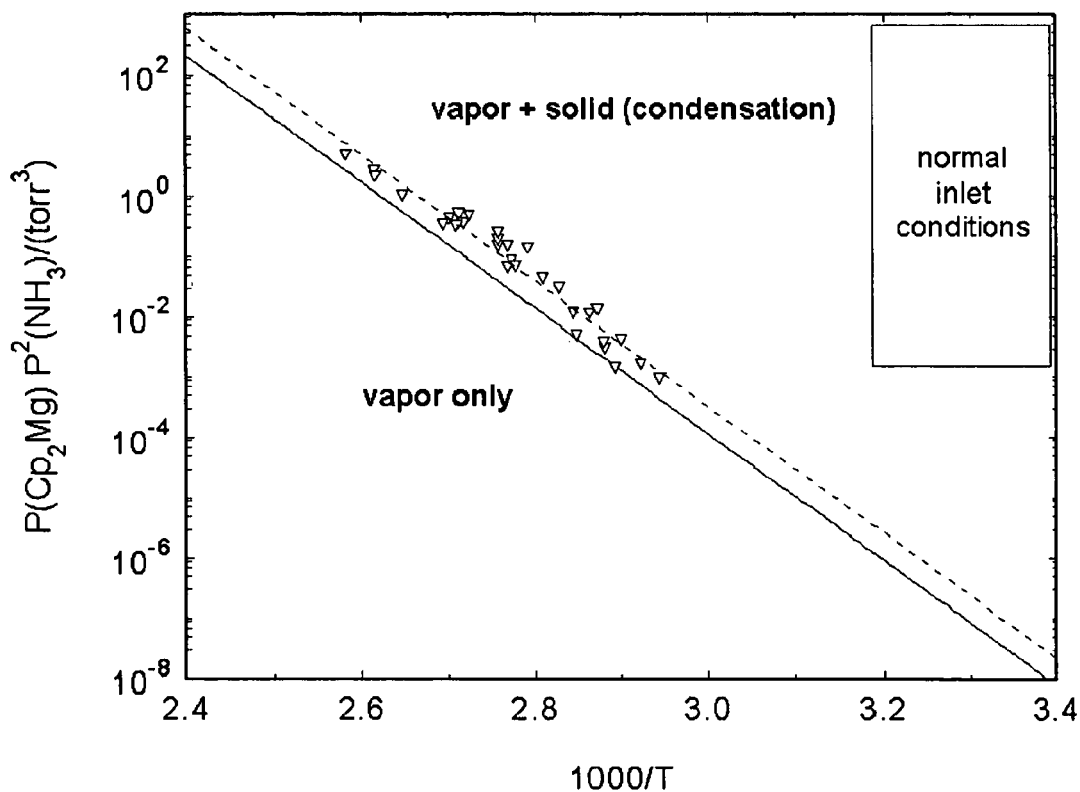
FIG. 3 illustrates the temperature regimes corresponding to vapor and vapor+solid for a range of partial pressures of magnesocene and ammonia.

Low temperatures and/or high reactant concentrations favor adduct formation, and as soon as the adduct partial pressure becomes equal to its vapor pressure condensation will occur (the region above the diagonal line in FIG. 3). This boundary is defined by the equilibrium constant (Eqn. 3) and the adduct vapor pressure (PV), and is given by the ratio Pv/Kp.

Figure 2:
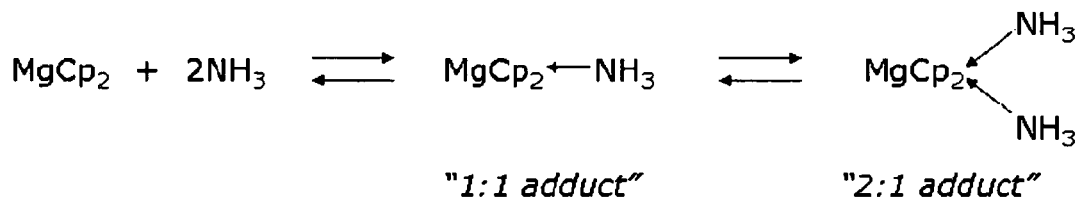
FIG. 2 illustrates the adducts that form from the reaction of magnesocene with ammonia.

For the case of magnesocene, the line in FIG. 3 describes the combinations of partial pressures of $Cp_2Mg$ and ammonia that can produce condensation of at least one of the adducts illustrated in FIG. 2. The data points in FIG. 3 were determined using a quartz crystal microbalance (QCM) to monitor condensation and to determine the condensation phase diagram for the $MgCp_2+NH_3$. The basic approach is to prepare a gas mixture at concentrations and temperatures just below the condensation boundary. This gas mixture or mixed gas then flows across the QCM held at a slightly colder temperature. If the QCM temperature is low enough to place the mixture above the condensation boundary (upper right hand portion of FIG. 3), then condensation will occur. Once an approximate condensation temperature has been established for a particular gas mixture, the boundary can be more precisely located by varying the $MgCp_2$ concentration or by changing the $NH_3$ concentration. The latter method can be more difficult in practice because significant changes in $NH_3$ concentration can alter the heat transfer of the system, causing the QCM temperature to drift. Some of the difficulties encountered with this technique are properly mixing the gases without producing condensation upstream of the QCM, and maintaining the proper temperature gradient in the system. Partial pressures of $NH_3$, $H_2$, and $MgCp_2$ for determining the condensation profile in FIG. 3 were in the same range as those commonly used for GaN MOCVD, although with the smaller cross sectional area of the QCM cell compared to a GaN substrate, the total flow rate was reduced to approximately half that commonly employed in GaN MOCVD. For most data presented in FIG. 3, a total flow rate of 7 SLM was used. The $NH_3$ flow rate ranged from 500-2000 sccm, but was set at 1000 sccm for most data in FIG. 3. The $H_2$ flow rate through the $MgCp_2$ bubbler (set at 18° C.) ranged from 0-1000 sccm, with other $H_2$ flow rates adjusted to keep a constant total flow rate of 7 SLM. Total pressure was varied from 50-400 Torr.

The $Cp_2Mg$ partial pressure in the reactor is calculated using the flow rate of the carrier gas through the bubbler and the $Cp_2Mg$ vapor pressure at the bubbler temperature. The $Cp_2Mg$ vapor pressure plotted in FIG. 3 is computed from the expression:

$$\log(P)=25.14-4.198/T-2.18\ln(T)$$

where ln=natural logarithm and log=base 10 logarithm. This expression is from G. B. Stringfellow, "Organometallic Vapor-Phase Epitaxy: Theory and Practice," Academic press, San Diego, 1999, 2nd edition, page 202. While this is a generally accepted equation defining the temperature dependence of the vapor pressure of magnesocene, if this relationship is found to be in error, substitution of a more correct relationship will shift the boundary defined in FIG. 3 in a manner that is readily determined by one skilled in the art of crystal growth.

The dashed line is the best fit to the data presented; there is some scatter due to experimental uncertainties in the determination of the condensation point. The solid line has been shifted downward to include all data points. The solid curve is given by $\log [P(Cp_2Mg)P^2(NH_3)]=-10440/T+27.38$ for partial pressures in Torr. This corresponds to a minimum gas or surface temperature that will avoid condensation or nucleation of $$T \geq 10440/[27.38-\log P(Cp_2Mg)P^2(NH_3)],$$

for pressures in Torr.

This temperature is termed the condensation temperature. The magnesocene-ammonia adduct condensation temperature is the temperature at which a given gas-phase concentration of adduct exceeds the equilibrium vapor pressure and can nucleate solid particles of adduct in the gas phase or on a surface.

The terms ammonia and ammonia gas comprises ammonia or ammonia in a carrier gas. The term magnesium precursor gas comprises a magnesium-containing compound that can serve as a source of magnesium atoms for MOCVD doping. The term magnesium precursor gas comprises magnesocene, cyclopentadienyl magnesium, bismethylcyclopentadienyl magnesium, magnesocene in a carrier gas, and bismethylcyclopentadienyl magnesium in a carrier gas. The term Group III precursor gas comprises a Group III precursor species and a Group III precursor species in a carrier gas. Examples of Group III precursor gases include but are not restricted trimethyl gallium, trimethyl aluminum, trimethyl indium, triethyl gallium, and triethyl aluminum. In many reactor configurations, the Mg precursor gas and one or more Group III precursor gas are combined (premixed) before their introduction to the reactor region where mixing with the ammonia gas occurs. Both premixing and not premixing are within the scope of this invention.

The term carrier gas comprises $H_2$, $N_2$, Ar, and other inert gases that are useful for MOCVD carrier gases as known those skilled in the art of nitride growth. When a carrier gas is combined with the Mg precursor species, the Group III precursor species, or ammonia, the same carrier gas does not have to be used with the different precursors.

The term precursor gas can include a magnesium precursor gas, a Group III precursor gas, an ammonia gas, and a carrier gas.

To avoid condensation as particles entrained in the gas flow, it is desirable to keep the total gas temperature above the adduct condensation temperature. This may be achieved by heating one or more of the gas flows such that the temperature of the gas flow that comprises a mixture of the Mg precursor gas and the ammonia gas does not fall below the adduct condensation temperature. The term mixed gas temperature for the purposes of this invention refers to the temperature of a mixture of gases that include the Mg precursor gas and ammonia.

Reactor surfaces are those surfaces with which the mixture of the Mg precursor gas and ammonia might come into contact before encountering the substrate or susceptor (the component of the reactor where the substrate resides during deposition). Reactor surfaces also include those surfaces from which desorbing material can reach the substrate or susceptor. Surfaces which serve as a source of volatile material that cannot reach the substrate or susceptor are excluded from the term "reactor surface" for the purpose of this invention.

To avoid adduct condensation on a reactor surface, the reactor surface is heated to a temperature above the adduct condensation temperature before the admission of the Mg precursor gas and ammonia into the reactor.

Since similar undesirable effects of adduct formation and condensation has been reported for the substituted magnesocene, bis(methylcyclopentadienyl) magnesium, $(MeCp)_2Mg$, (B. Beaumont, S. Haffouz, P. Gilbart, M. Leroux, Ph.Lorenzini, E. Calleja, and E. Monoz, "Violet GaN based light emitting diodes fabricated by metal organics vapour phase epitaxy,", Mater. Sci. Engin. B50 (1997) p. 296-301), the method of this invention is similarly applicable when using $(MeCp)_2Mg$ as a Mg-dopant source. Determination of a curve for $(MeCp)_2Mg$ (or any other readily condensible Mg source, with or without adduct formation) analogous to FIG. 3 for $Cp_2Mg$ will enable the use of this invention with other Mg-dopant precursors. Other substituted magnesocenes include bis(ethylcyclopentadienyl) magnesium and bis(n-propylcyclopentatienyl) magnesium. The term magnesocene is used to include magnesocene and substituted magnesocenes. The term magnesocene gas comprises magnesocene and magnesocene in a carrier gas.

The specification and drawings illustrate general concepts and process steps by way of specific implementations of the present invention. The matter set forth in the foregoing description and accompanying drawings is offered by way of illustration only and not as a limitation. Other variations and applications of the present invention will be apparent to those skilled in the art. It is intended that the scope of the invention be defined by the appended claims.

What is claimed:

1. A method for controllably doping a Group III-nitride material with Mg comprising:
   heating a plurality of reactor surfaces to a first temperature, the first temperature being higher than a magnesium precursor gas-ammonia adduct condensation temperature;
   heating at least one precursor gas to a second temperature prior to mixing of the at least one precursor gas, a magnesium precursor gas, and an ammonia gas, said second temperature being sufficiently high to provide a mixed gas temperature following mixing of the at least one precursor gas, the magnesium precursor gas, and the ammonia gas that is higher than the magnesium precursor gas-ammonia adduct condensation temperature;
   mixing the at least one precursor gas, the magnesium precursor gas, and the ammonia gas to form a mixed gas; and
   reacting the mixed gas with a surface of the Group III nitride material, thereby depositing a magnesium-doped Group III nitride layer.

2. The method of claim 1, wherein the magnesium precursor gas is a magnesocene.

3. The method of claim 2, wherein the magnesocene is selected from the group consisting of bis(cyclopentadienyl) magnesium, bis(methylcyclopentadienyl) magnesium, bis(ethylcyclopentadienyl) magnesium, and bis(n-propylcyclopentatienyl) magnesium.

4. The method of claim 1, wherein the at least one precursor gas is selected from the group consisting of the magnesium precursor gas, a Group III precursor gas, the ammonia gas, and a carrier gas.

5. A method for controllably doping a Group III-nitride material with Mg comprising:
   heating a plurality of reactor surfaces to a first temperature, the first temperature being higher than a magnesium precursor gas-ammonia adduct condensation temperature;
   controlling a mixed gas temperature, a pressure of a magnesium precursor gas, and a pressure of ammonia such that a combination of the mixed gas temperature is sufficiently high, the pressure of the magnesium precursor gas is sufficiently low, and the pressure of the ammonia is sufficiently low to prevent condensation of the magnesium precursor gas-ammonia adduct;
   reacting a mixed gas comprising a Group III precursor gas, the magnesium precursor gas, and ammonia with a surface of the Group III nitride material, thereby depositing thereon a magnesium-doped Group III nitride layer.

6. The method of claim 5, wherein the magnesium precursor gas is a magnesocene.

7. The method of claim 6, wherein the magnesocene is selected from the group consisting of bis(cyclopentadienyl) magnesium, bis(methylcyclopentadienyl) magnesium, bis(ethylcyclopentadienyl) magnesium, and bis(n-propylcyclopentatienyl) magnesium.

8. A method for controllably doping a Group III-nitride material with Mg comprising:
   heating a plurality of reactor surfaces to a first temperature, the first temperature being higher than a magnesocene-ammonia adduct condensation temperature;
   heating at least one precursor gas to a second temperature prior to mixing of the at least one precursor gas, a magnesocene gas, and an ammonia gas, the second temperature being sufficiently high to provide a mixed gas temperature following mixing of the at least one precursor gas, the magnesocene gas, and the ammonia gas that is higher than the magnesocene-ammonia adduct condensation temperature;
   mixing the at least one precursor gas, the magnesocene gas and the ammonia gas to form a mixed gas; and
   reacting the mixed gas with a surface of the Group III nitride material, thereby depositing a magnesium-doped Group III nitride layer.

9. The method of claim 8, wherein a magnesocene of the magnesocene gas is selected from the group consisting of bis(cyclopentadienyl) magnesium, bis(methylcyclopentadienyl) magnesium, bis(ethylcyclopentadienyl) magnesium, and bis(n-propylcyclopentatienyl) magnesium.

10. The method of claim 8, wherein the at least one precursor gas is selected from the group consisting of the magnesocene gas, the Group III precursor gas, the ammonia gas, and a carrier gas.

* * * * *